United States Patent
Kwak (10) Patent No.: US 7,537,992 B2
(45) Date of Patent: May 26, 2009

(54) METHOD FOR MANUFACTURING FLASH MEMORY DEVICE

(75) Inventor: Sung Ho Kwak, Seoul (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 83 days.

(21) Appl. No.: 11/454,350

(22) Filed: Jun. 16, 2006

(65) Prior Publication Data
US 2006/0292796 A1    Dec. 28, 2006

(30) Foreign Application Priority Data
Jun. 22, 2005   (KR) .................... 10-2005-0053952

(51) Int. Cl.
*H01L 21/336* (2006.01)
(52) U.S. Cl. ................ 438/257; 257/E27.104
(58) Field of Classification Search ................ 438/257; 257/E27.104
See application file for complete search history.

(56) References Cited

U.S. PATENT DOCUMENTS

| | | | |
|---|---|---|---|
| 6,583,008 B2 * | 6/2003 | Lee et al. ................ | 438/257 |
| 6,867,063 B1 * | 3/2005 | Ghandehari et al. ........ | 438/72 |
| 7,101,759 B2 * | 9/2006 | Han ................ | 438/257 |
| 7,199,034 B1 * | 4/2007 | Kwak ................ | 438/593 |
| 2003/0003659 A1 * | 1/2003 | Lee et al. ................ | 438/257 |
| 2004/0185619 A1 * | 9/2004 | Chung ................ | 438/257 |
| 2006/0110882 A1 * | 5/2006 | Liu et al. ................ | 438/257 |

FOREIGN PATENT DOCUMENTS

| KR | 10-2001-0035008 | 12/2002 |
|---|---|---|
| KR | 10-2003-0043675 | 1/2005 |

* cited by examiner

*Primary Examiner*—Thao P. Le
(74) *Attorney, Agent, or Firm*—Saliwanchik, Lloyd & Saliwanchik

(57) ABSTRACT

A flash memory device incorporating: a semiconductor substrate having an active region and a field region defined therein; a device isolation layer formed in the field region of the substrate; a floating gate having an edge portion overlapping the device isolation layer, the overlapped portion being etched back a depth about equal to a height of a protruding portion of the device isolation layer, the floating gate having a tunneling oxide layer interposed in the active region of the semiconductor substrate; and a gate insulation layer and a control gate sequentially formed on the floating gate.

14 Claims, 6 Drawing Sheets

METHOD FOR MANUFACTURING FLASH MEMORY DEVICE

RELATED APPLICATION

This application claims the benefit, under 35 U.S.C. §119 (e), of Korean Patent Application Number 10-2005-0053952 filed Jun. 22, 2005, which is incorporated herein by reference in its entirety.

FIELD OF THE INVENTION

The present invention relates to a method for manufacturing a semiconductor device, and more particularly, to a flash memory device having an improved roughness of a floating gate, and a method for manufacturing the same.

BACKGROUND OF THE INVENTION

Generally, nonvolatile memory devices can retain data even when the power is turned off. Therefore, nonvolatile memory devices are widely used as data storage devices for PC Bios, Set-tops, printers, network servers, and other such devices. Recently, nonvolatile memory devices have also been used in digital cameras and mobile phones.

One such nonvolatile memory device, is an Electrically Erasable Programmable Read-Only Memory (EEPROM). An EEPROM can electrically erase data of memory cells one at a time or on a sector basis. For a program operation, channel hot electrons are formed at a drain and electrons are accumulated in a floating gate, thus increasing the threshold voltage of the cell transistor.

For an erase operation, a high voltage is generated between a source and a floating gate and the electrons accumulated at the floating gate are discharged, thus decreasing the threshold voltage of the cell transistor.

Two examples of the typical cell structures of the EEPROM are an EPROM tunnel oxide (ETOX) cell having a simple stacked structure, and a split gate type cell having two transistors per cell.

In the case of the ETOX cell, a floating gate for storing electric charges and a control gate to which a driving voltage is applied are stacked. In the case of the spilt gate type cell, one memory cell includes two transistors, that is, a selection transistor for selecting a cell and a memory transistor for storing data.

The memory transistor includes a floating gate for storing the electric charges, a control gate for controlling the memory transistor, and a gate insulating layer interposed therebetween.

Figure 1:
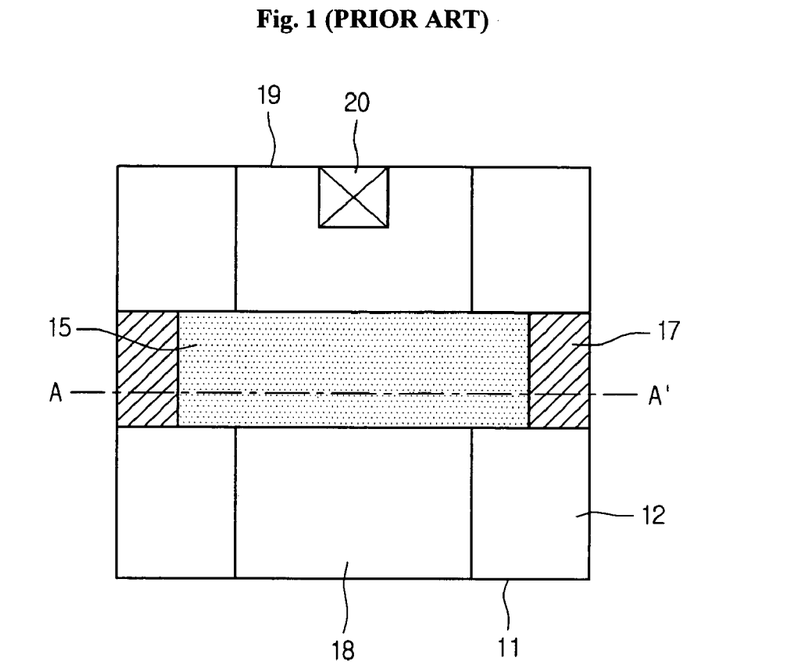
FIG. 1 is a plan view of a prior art flash memory device.
Figure 2:
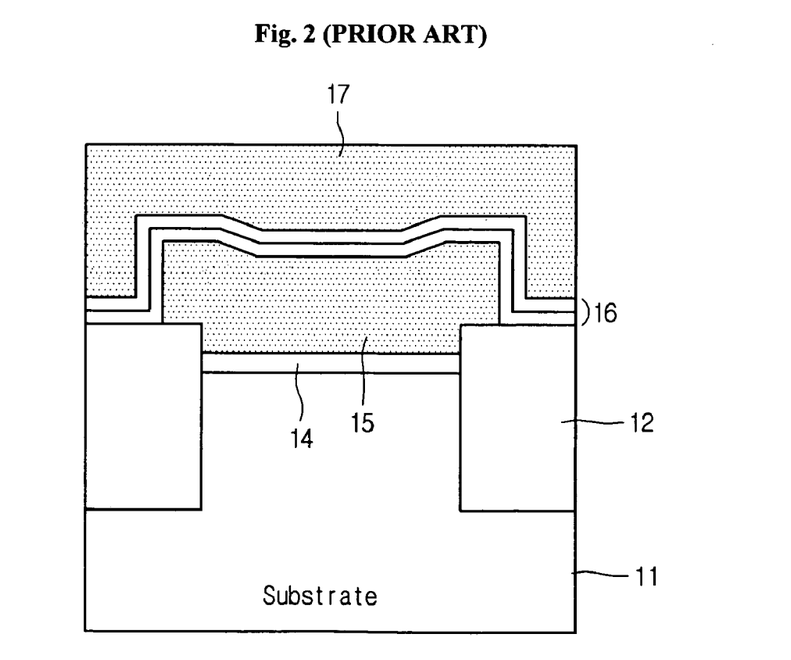
FIG. 2 is a sectional view taken along line A-A' of FIG. 1.

FIG. 1 is a plan view of a prior art flash memory device and FIG. 2 is a sectional view taken along line A-A' of FIG. 1.

Referring to FIGS. 1 and 2, a field oxide layer 12 is formed in a semiconductor substrate 11 to define a field region and an active region in the substrate 11.

A floating gate 15 is formed over the active region and the field oxide region such that an edge of the floating gate 15 partially overlaps the field oxide layer 12. Also, a control gate 17 is formed on the floating gate 15 such that it overlaps the floating gate 15.

A tunneling oxide layer 14 is formed between the floating gate 15 and the semiconductor substrate 11, and an oxide-nitride-oxide (ONO) layer 16 is formed between the control gate 17 and the floating gate 15.

The floating gate 15 stores electric charges and the control gate 17 maintains a voltage of the floating gate 15.

A source region 18 and a drain region 19 are formed on both sides of the floating gate 15 and the control gate 17 in the active region of the semiconductor substrate 11, and a drain contact 20 is formed in the drain region 19.

FIGS. 3A to 3D are sectional views through line A-A' of FIG. 1 illustrating a method of manufacturing a related prior art flash memory device.

Figure 3A:
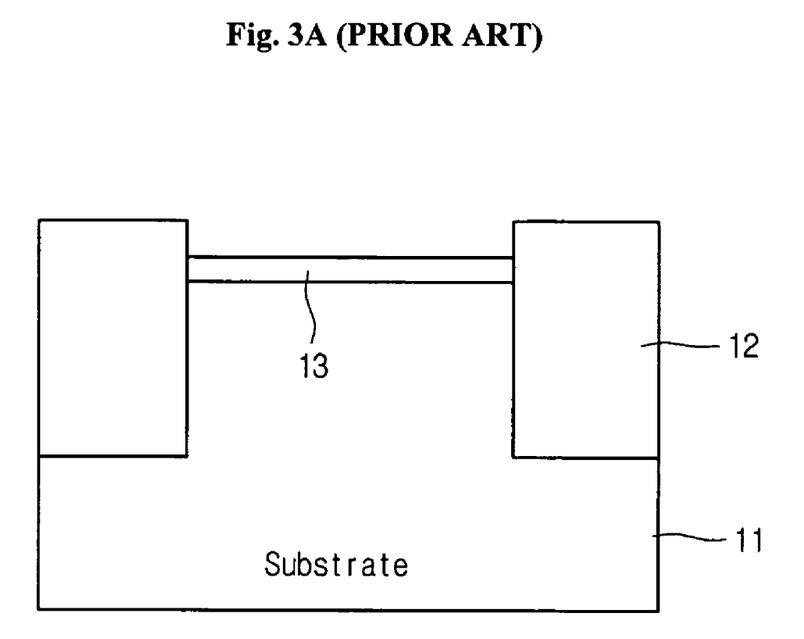
FIGS. 3A to 3D are sectional views illustrating a method of manufacturing a prior art flash memory device.

Referring to FIG. 3A, a buffer oxide layer 13 is formed on the semiconductor substrate 11 and is selectively removed to expose a portion of the semiconductor substrate 11, which will be defined as a field region by a photo and etching process.

A trench is formed in the semiconductor substrate 11 using the buffer oxide layer 13 as a mask. Then, the trench is filled with an oxide layer to form a field oxide layer 12 having a Shallow Trench Isolation (STI) structure.

Then, impurity ions are implanted to form a well (not shown).

Figure 3B:
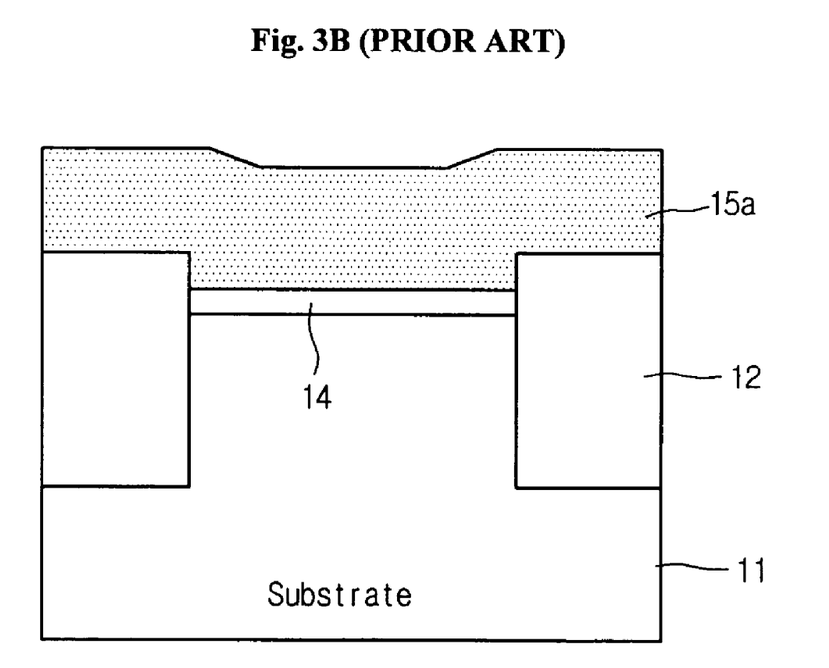

Referring to FIG. 3B, the buffer oxide layer 13 is removed and a tunneling oxide layer 14 is formed on the semiconductor substrate 11. Then, a first polysilicon layer 15a is deposited on the resulting structure.

Figure 3C:
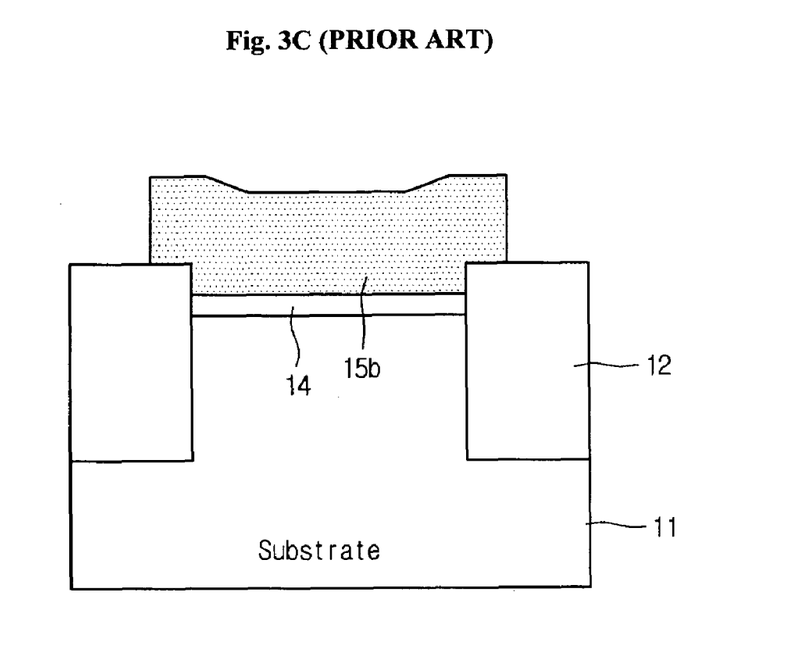

Referring to FIG. 3C, a first polysilicon pattern 15b is formed by selectively etching the first polysilicon layer 15a using a photo and etching process such that the polysilicon remains on the active region of the semiconductor substrate 11 and a portion of adjacent field oxide layer 12.

Figure 3D:
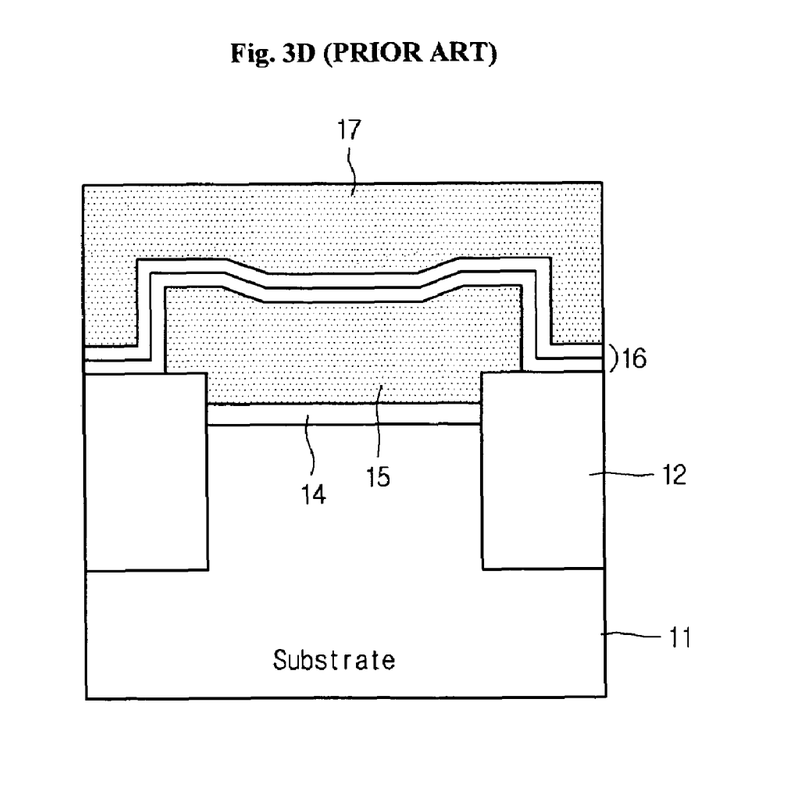

Referring to, FIG. 3D, an ONO layer 16 and a second polysilicon layer are sequentially formed on the entire surface of the semiconductor substrate 11 and the first polysilicon pattern 15b. A photoresist (not shown) is coated on the semiconductor substrate 11 and then patterned to expose the second polysilicon layer in a direction crossing the active region.

Using the patterned photoresist as a mask, the polysilicon layer, the ONO layer 16, and the first polysilicon pattern 15b are etched to form a stacked gate having a floating gate 15 and a control gate 17.

Although not shown, the source region 18 and the drain region 19 are formed by implanting impurity ions into the active region of the semiconductor substrate 11 using the control gate 17 as a mask. Then, an interlayer insulating layer is formed on the entire surface of the resulting structure, and a drain contact 20 is formed on the interlayer insulating layer to connect the drain region 19 to a bit line (BL).

However, in forming the floating gate, a height difference problem occurs between a center portion and an edge portion of the floating gate due to the device isolation layer having an STI structure at the edge portion of the floating gate. Just as the floating gate is higher at its edge portion than at its center portion, the ONO layer formed on the floating gate experiences the height difference. This height difference can also be referred to as roughness.

Consequently, the uniformity of the conductive layer formed on the ONO layer is deteriorated, causing the degradation in the electric characteristics of the devices manufactured using the above described patterning technique.

SUMMARY OF THE INVENTION

Accordingly, the present invention is directed to a flash memory device and a method for manufacturing the same that addresses and/or substantially obviates one or more problems, limitations, and/or disadvantages of the prior art.

An object of the present invention is to provide a flash memory device that can improve the roughness of a floating gate, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a flash memory device incorporating: a semiconductor substrate having an active region and a field region defined therein; a device isolation layer formed in the field region of the substrate; a tunneling oxidation layer formed on the active region; a floating gate formed on the entire tunneling oxidation layer and a portion of the device isolation layer, wherein the portion overlapping the device isolation layer is etched back a depth about equal to a height of a protruding portion of the device isolation layer; and a gate insulation layer and a control gate sequentially formed on the floating gate.

In another aspect of the present invention, there is provided a method of manufacturing a flash memory device, incorporating: preparing a semiconductor substrate having an active region and a field region defined therein; forming a device insulating layer in the field region of the substrate; forming a tunneling oxide layer in the active region of the substrate; forming a first polysilicon layer on the tunneling oxide layer; coating a photoresist on the first polysilicon layer and selectively patterning the coated photoresist to define a floating gate region; etching the overlapped portion of the first polysilicon layer by a predetermined thickness by using the patterned photoresist as a mask; forming a polymer on the sides of the patterned photoresist; forming a floating gate by selectively removing the polysilicon layer using the photoresist and the polymer as a mask; and removing the photoresist and the polymer.

In a further another aspect of the present invention, there is provided a method of manufacturing a flash memory device, incorporating: providing a substrate having a field region and an active region defined therein; forming a device isolation layer in the field region of the substrate; forming a polysilicon layer on the substrate where the device isolation layer is formed; forming a planarization layer on the substrate where the polysilicon layer is formed; coating a photoresist on the substrate where the planarization layer is formed, and patterning the coated photoresist in the active region; removing a portion of the planarization layer and the polysilicon layer formed in the field region by using the patterned photoresist as a mask, such that a surface of the polysilicon layer has the same roughness; forming a polymer on a side of the patterned photoresist and a side surface of the etched polysilicon layer; and etching the polysilicon layer to form a floating gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A flash memory device and a method for manufacturing the same according to the present invention will now be described with reference to the accompanying drawings.

Figure 4A:
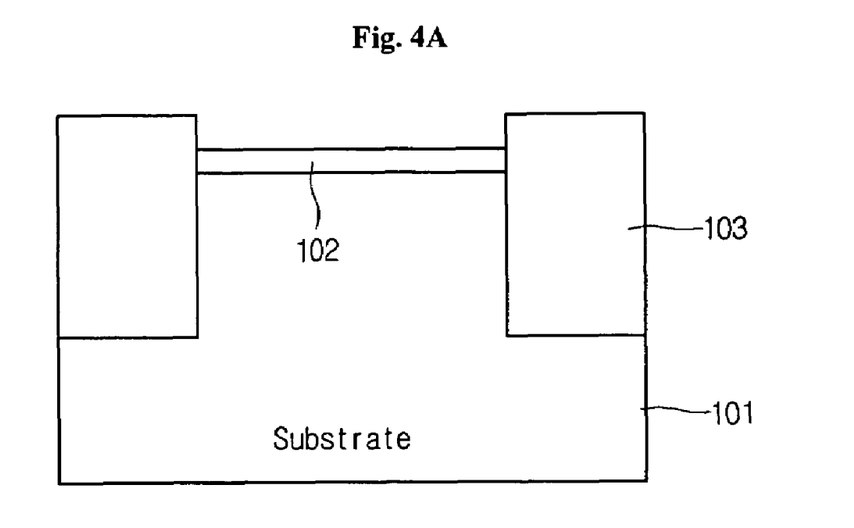
FIG. 4A to 4F are sectional views illustrating a method of manufacturing a flash memory device according to an embodiment of the present invention.
Figure 4B:
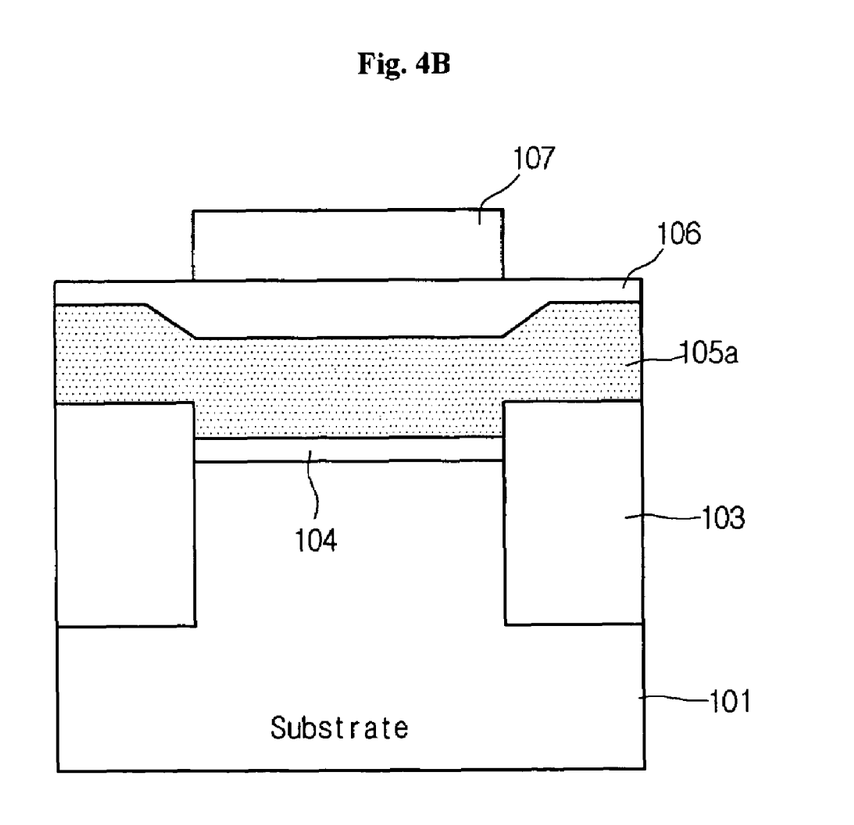
Figure 4C:
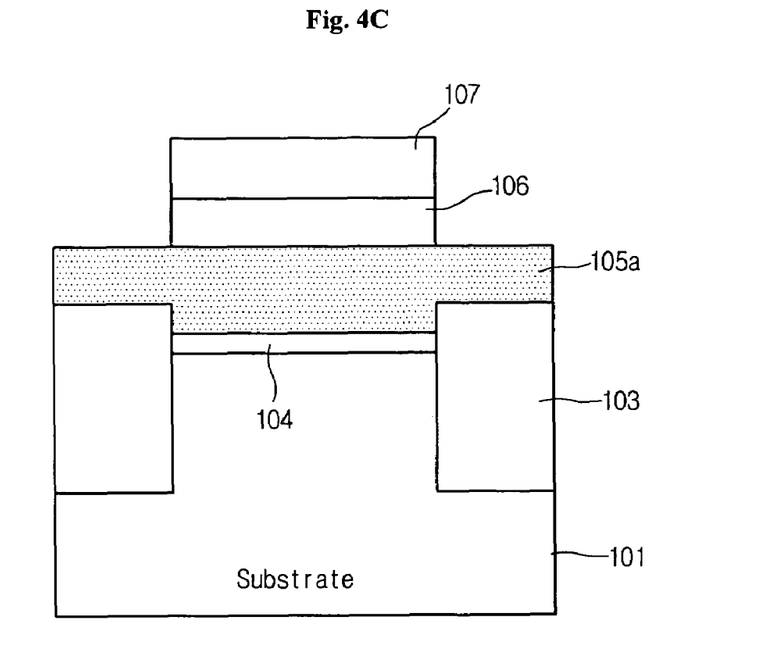
Figure 4D:
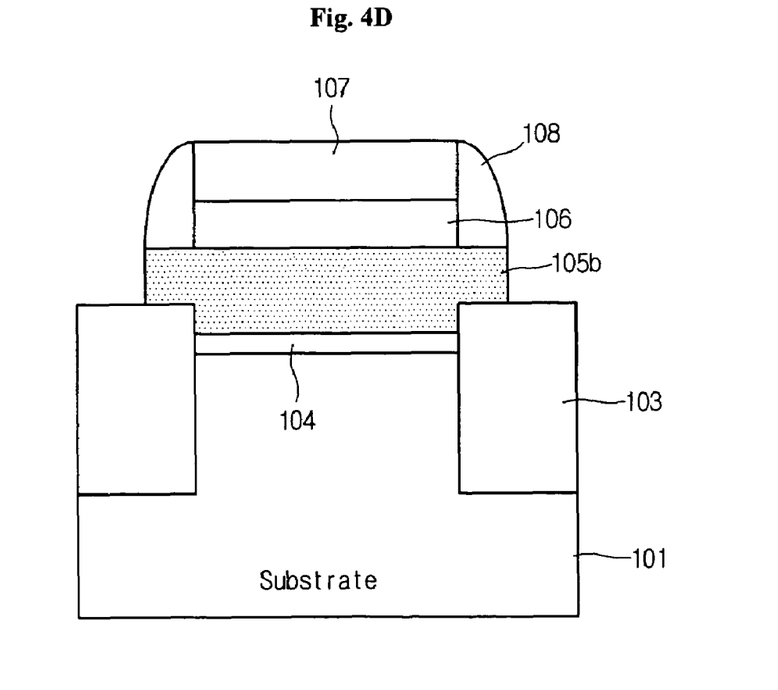
Figure 4E:
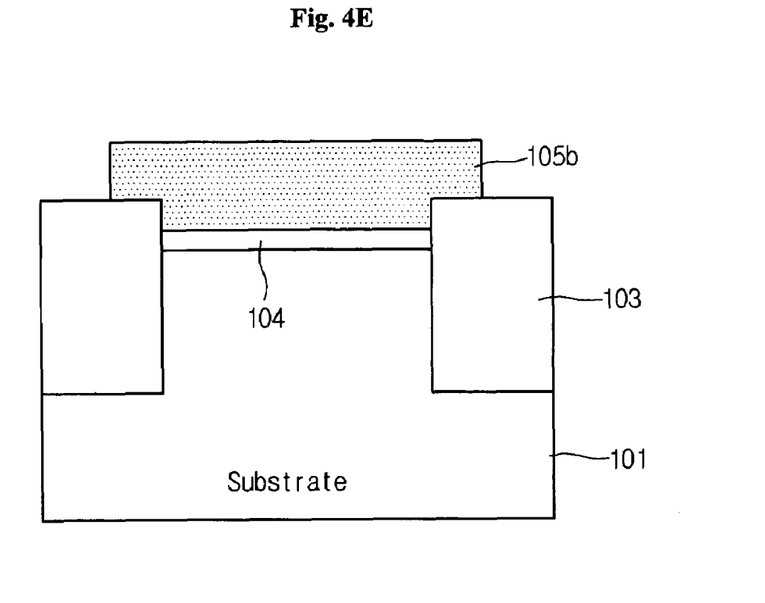
Figure 4F:
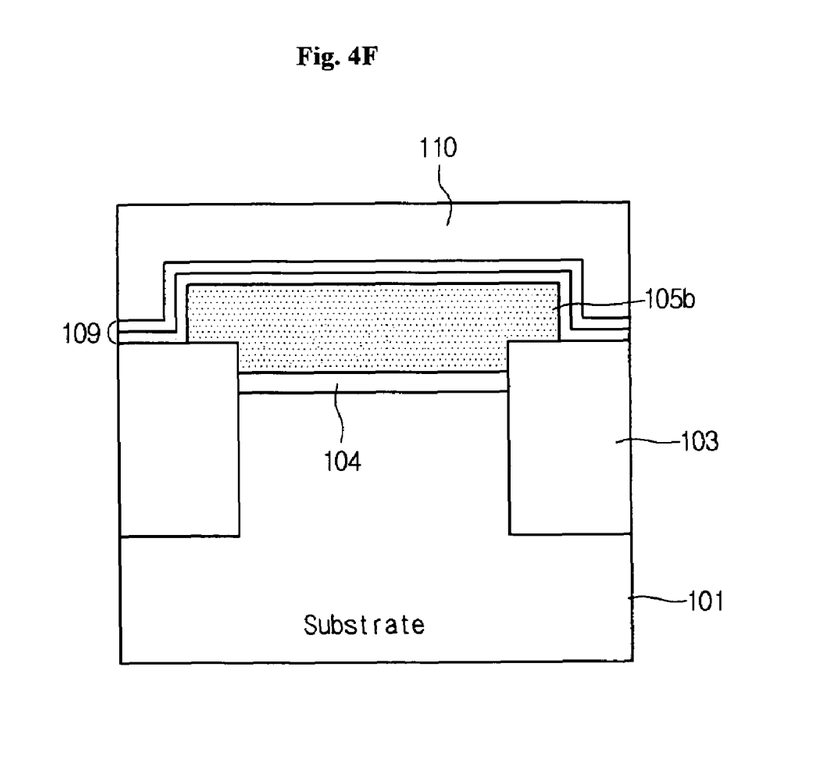

As illustrated in FIG. 4F, according to embodiments of a flash memory device of the present invention, an active region and a field region can be defined in a substrate 101. A field oxide layer 103 can be formed in the field region. A floating gate 105b overlaps an edge portion of the field oxide layer 103, the overlapped portion having been etched back about equal to a height of the protruding portion of the field oxide layer 101. A tunneling oxide layer 104 can be formed between the active region of the semiconductor substrate 101 and the floating gate 105b. An ONO layer 109 and a control gate 110 can be sequentially formed on the floating gate 105b.

FIGS. 4A to 4F are sectional views illustrating a method of manufacturing a flash memory device according to the present invention.

Referring to FIG. 4A, a field region can be defined on a substrate by forming a buffer oxide layer 102 on a semiconductor substrate 101. In one embodiment, the buffer oxide layer 102 can be selectively removed using a photo and etching process to expose a portion of the semiconductor substrate 101.

Then, using the buffer oxide layer 102 as a mask, a trench having a predetermined depth can be formed in the semiconductor substrate 101. The trench can be filled with an oxide layer to form a field oxide layer 103 having an STI structure.

A well (not shown) can be formed in the substrate by implanting impurity ions.

Referring to FIG. 4B, the buffer oxide layer 102 can be removed, and a tunneling oxide layer 104 can be formed on the semiconductor substrate 101. A first polysilicon layer 105a can then be deposited on the entire surface of the resulting structure.

In one embodiment, an anti-reflective layer 106 can be formed on the first polysilicon layer 105a. A photoresist 107 can then be coated on the anti-reflective layer 106. In a preferred embodiment, the anti-reflective layer 106 is formed of organic material. The anti-reflective layer 106 can be used to planarize the stepped first polysilicon layer 105a.

Due to the non-uniformity of the first polysilicon layer 105a, the anti-reflective layer 106 can be formed thicker in the region of the tunneling oxide layer 104 than in the field oxide layer 103.

Then, the photoresist 107 can be patterned using a photo and etching process to define the floating gate region.

The photoresist 107 can be patterned such that it remains only on the entire active region of the semiconductor substrate 101, but not on the field oxide layer 103.

Referring to FIG. 4C, the anti-reflective layer 106 can be selectively removed using the patterned photoresist 107 as a mask.

Then, the first polysilicon layer 105a can be selectively etched by a predetermined thickness from its surface, including the portion of its surface overlapping the field oxide layer 103.

In one embodiment, the first polysilicon layer 105a, whose surface is somewhat higher in the region of the field oxide layer 103, can be etched to have the same height as the surface of the first polysilicon layer 105a formed on the tunneling oxide layer 104.

The etching process can enable the entire surface of the first polysilicon layer 105a to have the same roughness.

Therefore, the present invention can remove the non-uniformity of the first polysilicon layer 105a formed on the semiconductor substrate 101 without any additional polishing process, thereby improving the uniformity of the semiconductor patterns and the electrical characteristics.

Referring to FIG. 4D, in a further embodiment, a polymer 108 can be formed on both sides of the photoresist 107 and the anti-reflective layer 106 by using, for example, fluorine-based gas on the entire surface of the resulting structure.

Then, using the polymer 108 and photoresist 107 as a mask, a first polysilicon pattern 105b can be formed from the first polysilicon layer 105a by a selective etching process.

Referring to FIG. 4E, the photoresist 107 and the polymer 108 can be removed from the semiconductor substrate 101. In a specific embodiment, the photoresist 107 and polymer 108 can be removed by an oxygen ($O_2$) ashing process and a cleaning process.

Referring to FIG. 4F, an ONO layer 109 and a second polysilicon layer can be sequentially formed on the entire surface of the semiconductor substrate 101 and the first polysilicon pattern 105b.

A photoresist (not shown) can be coated on the semiconductor substrate 101 and patterned to expose the second polysilicon layer in a direction crossing the active region of the semiconductor substrate 101.

Then, using the patterned photoresist as a mask, the second polysilicon layer, the ONO layer 109, and the first polysilicon pattern 105b can be selectively etched to form a stacked gate.

Although not shown, source and drain regions can be formed by implanting impurity ions into the active region using the control gate 110 as a mask. An interlayer insulating layer can be formed on the entire surface of the resulting structure and a drain contact can be formed on the interlayer insulating layer to connect the drain region to a bit line.

For a program operation, a programming voltage can be applied through a word line (WL) and the bit line (BL), which are connected to the control gate 110 and the drain region, respectively. Then, electrons existing at the drain region are injected in a hot-carrier method through the tunneling oxide layer 104 toward the floating gate 105. Through these processes, the cell transistor can be programmed.

For an erase operation, an erase voltage can be applied through a source line (SL) formed in the source region. The electrons injected into the floating gate 105 are discharged through the tunneling oxide layer 104 toward the channel. Consequently, the threshold voltage of the cell transistor is lowered, thereby achieving the erase operation.

As described above, in the edge portion of the floating gate, the floating gate is formed by selectively etching the portion overlapping the device isolation layer by a predetermined thickness from the surface thereof. Consequently, the step at the center portion and the edge portion can be minimized, thereby improving the roughness of the floating gate.

It will be apparent to those skilled in the art that various modifications and variations can be made in the present invention. Thus, it is intended that the present invention covers the modification and variations of this invention provided they come within the scope of the appended claims and their equivalents.

I claim:

1. A method of manufacturing a flash memory device, comprising:
   preparing a semiconductor substrate having an active region and a field region;
   forming a device insulating layer in the field region;
   forming a tunneling oxide layer on the active region;
   forming a first polysilicon layer on the tunneling oxide layer;
   coating a photoresist on the first polysilicon layer and selectively patterning the coated photoresist to define a floating gate region, wherein the patterned photoresist is only on the active region;
   etching by a predetermined thickness a portion of the first polysilicon layer overlapping the device insulating layer using the patterned photoresist as a mask;
   forming a polymer on sides of the patterned photoresist;
   forming a floating gate by selectively removing the polysilicon layer using the photoresist and the polymer as a mask; and
   removing the photoresist and the polymer.

2. The method according to claim 1, further comprising:
   forming a gate insulating layer on the floating gate; and
   forming a control gate on the gate insulating layer.

3. The method according to claim 1, wherein the polymer is formed using a fluorine-based gas.

4. The method according to claim 1, wherein removing the photoresist and the polymer comprises performing an oxygen ashing process and a cleaning process.

5. The method according to claim 1, further comprising forming a planarization layer on the first polysilicon layer prior to the coating of the photoresist.

6. The method according to claim 5, wherein the planarization layer is an anti-reflective layer formed of an organic material.

7. The method according to claim 1, wherein etching an overlapped portion of the first polysilicon layer causes the first polysilicon layer to have the same roughness as a surface of the first polysilicon layer formed on the active region.

8. A method of manufacturing a flash memory device, comprising:
   providing a substrate having a field region and an active region;
   forming a device isolation layer in the field region;
   forming a polysilicon layer on the substrate;
   forming a planarization layer on the polysilicon layer;
   coating a photoresist on the planarization layer, and patterning the coated photoresist, wherein the patterned photoresist is only on the active region;
   removing a portion of the planarization layer and the polysilicon layer formed on the field region by using the patterned photoresist as a mask, such that a surface of the polysilicon layer formed on the field region has the same roughness as a surface of the polysilicon layer below the patterned photoresist;
   forming a polymer sidewall on the patterned photoresist; and
   etching the polysilicon layer to form a floating gate.

9. The method according to claim 8, wherein the floating gate is formed by etching the polysilicon layer formed on the field region using the polymer sidewall and patterned photoresist as a mask.

10. The method according to claim 8, further comprising forming a tunneling oxide layer on the active region of the substrate.

11. The method according to claim 8, wherein both edges of the floating gate overlap a portion of the device isolation layer formed in the field region.

12. The method according to claim 8, wherein the planarization layer is formed of an organic material.

13. The method according to claim 8, wherein the polymer is formed using a fluorine-based gas.

14. The method according to claim 8, further comprising removing the photoresist and the polymer by using an oxygen ashing process and a cleaning process.

* * * * *